United States Patent [19]

Matsushima et al.

[11] Patent Number: 4,756,175

[45] Date of Patent: Jul. 12, 1988

[54] CLAMP MECHANISM OF AN ELECTRONIC APPARATUS

[75] Inventors: Jyunji Matsushima; Shinji Miyata; Kunitoshi Yoshitaka, all of Amagasaki, Japan

[73] Assignee: Mitsubishi Denki Kubushiki Kaisha, Japan

[21] Appl. No.: 24,618

[22] Filed: Mar. 11, 1987

[30] Foreign Application Priority Data

Mar. 28, 1986 [JP] Japan ................................ 61-46816

[51] Int. Cl.$^4$ ............................................. F16B 41/00
[52] U.S. Cl. ........................................... 70/229; 70/57; 70/14; 70/190; 248/553
[58] Field of Search .............. 70/229, 230, 232, 190, 70/191, 14, 57, 58, DIG. 72; 248/551–553

[56] References Cited

U.S. PATENT DOCUMENTS

| | | | |
|---|---|---|---|
| 1,370,970 | 3/1921 | Jordan | 70/190 X |
| 1,687,966 | 10/1928 | Baver | 70/230 X |
| 3,526,110 | 9/1970 | Foote | 70/58 X |
| 3,696,646 | 10/1972 | Loscalzo | 70/232 X |
| 3,766,759 | 10/1973 | Artner | 248/553 X |
| 3,895,768 | 7/1975 | Scheck | 248/553 |
| 3,908,942 | 9/1975 | Keith et al. | 70/58 X |
| 4,072,031 | 2/1978 | Kent | 70/58 |
| 4,305,266 | 12/1981 | Lockwood | 248/553 X |
| 4,556,188 | 12/1985 | Allison, Jr. | 248/553 |
| 4,603,829 | 8/1986 | Koike et al. | 248/553 |

FOREIGN PATENT DOCUMENTS 57-130487  8/1982  Japan .

Primary Examiner—Robert L. Wolfe
Assistant Examiner—Suzanne L. Dino
Attorney, Agent, or Firm—Robert F. O'Connell

[57] ABSTRACT

In a clamp mechanism for an electronic apparatus, a part of knurled wheel is exposed from a housing so as to manually rotate a male screw for clamping the electronic apparatus, and rotation of the knurled wheel is locked by a key-lock means for protection against burglary.

4 Claims, 5 Drawing Sheets

CLAMP MECHANISM OF AN ELECTRONIC APPARATUS

FIELD OF THE INVENTION AND RELATED ART STATEMENT

1. Field of the Invention

The present invention generally relates to a clamp mechanism of an electronic apparatus, and especially relates to a clamp mechanism of a telephone for an automobile.

2. Description of the Related Art

The conventional clamp mechanism of the electronic apparatus (for example, described in the Japanese Utility Model Application No. Sho 58-190480) is shown in FIG. 1(a), FIG. 1(b), FIG. 1(c) and FIG. 1(d). FIG. 1(a) shows a whole constitution of a clamp mechanism, FIG. 1(b) shows a plan view of a table of the clamp mechanism, FIG. 1(c) shows a front view of the clamp mechanism, and FIG. 1(d) shows the details of a lock part of the clamp mechanism. In the drawing, elements marked by the same numerals are the same elements or corresponding to the same part. In FIG. 1, an electronic apparatus 1 has a front protrusion 1b and a rear protrusion 1a. A table 2 which is fixed in a cabin of an automobile or the like has a pocket 2a for receiving to hold the rear protrusion 1a of the electronic apparatus 1. A lock unit 3 has a guiding protrusion 3a, the electronic apparatus 1 and a hole 3b, and the lock unit 3 is fixed on the table 2 by screws 3c and 3c. A lock 7 is inserted into the lock unit 3, and a lever 8 is fixed at the bottom of the lock 7. The electronic apparatus 1 is fixed on the table 2 by supporting the front protrusion 1b with a pressing plate 4 which is fixed on the table 2 by a screw 5 and a spring 6.

The fixing process of the electronic apparatus such as a telephone on the automobile or the like is described as follows. At first, the table 2 is previously fixed, for example, on a console box of the automobile. And also the pressing plate 4 is raised to a position where the front protrusion 1b of the electronic apparatus 1 can be fit in by loosening the screw 5. Hereupon, the pressing plate 4 is raised by the force of the spring 6 by only loosening of the screw 5. The rear protrusion 1a of the electronic apparatus is put into the pocket 2a of the table 2 and the front protrusion 1b of the electronic apparatus 1 is put along the guiding protrusion 3a of the lock unit 3. Next, the screw 5 is tightened by a tool, for example, a screw driver, inserted in the hole 3b of the lock unit 3. As a result, the pressing plate 4 falls down and pushes the front protrusion 1b. At the same time, the rear protrusion 1a of the electronic apparatus 1 fits to the pocket 2a of the table 2. Accordingly, the electronic apparatus 1 is firmly fixed on the table 2.

After that, a key (which is not shown in the figures) is put into the lock 7 and the lever 8 is rotated for closing the hole 3b of the lock unit 3 by the rotation of the key. The lock 7 is locked and the screw 5 can not be loosened from the exterior of the lock unit 3.

In the opposite way, for taking the electronic apparatus 1 away from the table 2, the lock 7 is released and the hole 3b is opened by the rotation of the lock 7 and the lever 8, and the screw 5 is loosened by the tool.

As mentioned above, the conventional clamp mechanism of the electronic apparatus needs the tool such as the screw driver, and also the pressing plate 4 needs to be raised to the position where the front protrusion 1b of the electronic apparatus 1 can be fit in the pocket 2a of the table 2. As a result, the working efficiency was lower at installation or dismantlement of the electronic apparatus.

OBJECT AND SUMMARY OF THE INVENTION

The object of the present invention is to settle the above-mentioned problems and to provide an improved clamp mechanism of an electronic apparatus without using any tool and having antitheft check function by locking.

The clamp mechanism of the electronic apparatus in accordance with the present invention comprises, a knurled wheel having a male screw at its center axis which screws a female screw on the bottom of an electronic apparatus and plural knurling grooves at its peripheral part, a hook lever which locks or unlocks the rotation of the knurled wheel by involving with or being detached from the knurling grooves at the peripheral part of the knurled wheel, a lock means for controlling the position of the hook lever for locking or unlocking the rotation of the knurled wheel corresponding to key operation, a bottom cover for mounting the knurled wheel, the hook lever, the lock means, electric cables and the like and fixed on the bottom of a housing, and a housing for being fixed on a console box of an automobile or the like, which has at least one protrusion for connecting a pocket of the electronic apparatus, an opening for exposing a part of the knurling grooves at the peripheral part of the knurled wheel and a hole for thrusting the male screw of the knurled wheel.

DESCRIPTION OF THE PREFERRED EMBODIMENT

A preferred embodiment of a clamp mechanism of an electronic apparatus in accordance with the present invention is described as follows with reference to FIG. 2, FIG. 3, FIG. 4(a) and FIG. 4(b).

Figure 1A:
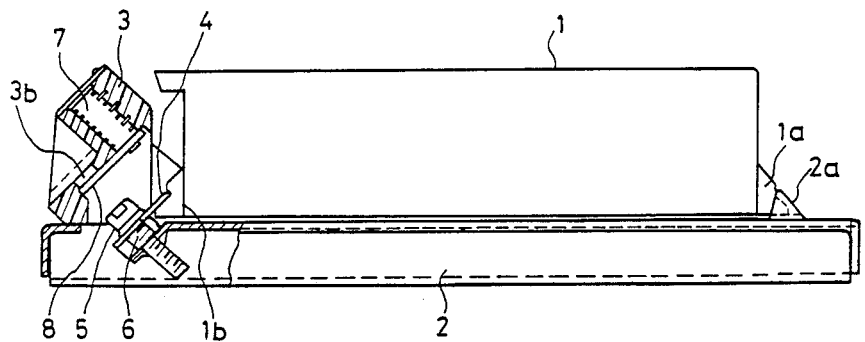
FIG. 1(a) is the partially cross-sectional side view showing the conventional clamp mechanism of an electronic apparatus.
Figure 1B:
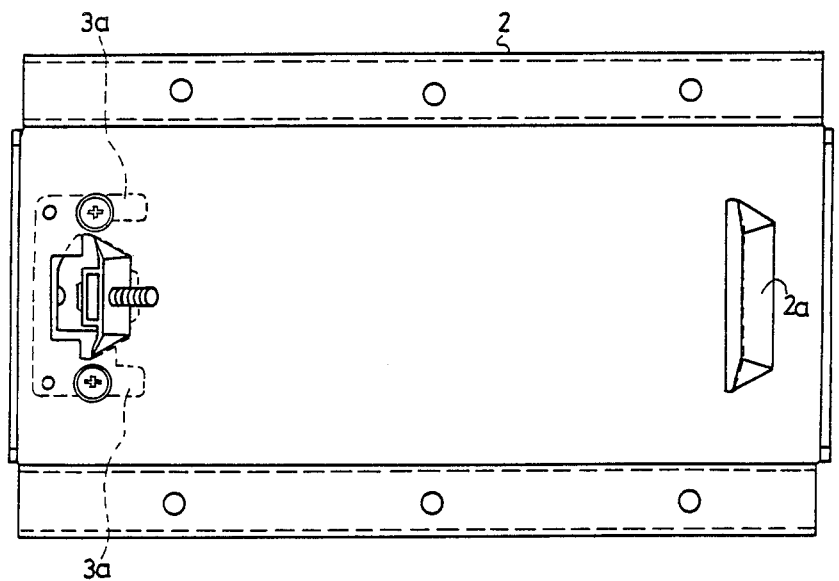
FIG. 1(b) is the plan view showing the bottom of the conventional clamp mechanism of an electronic apparatus.
Figures 1C, 1D:
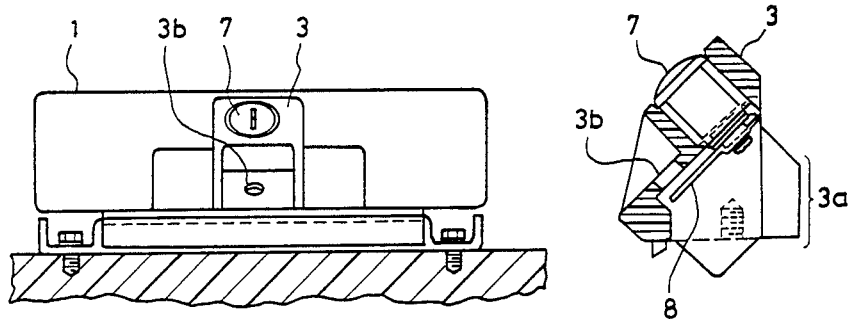
FIG. 1(c) is the front view showing the conventional clamp mechanism of an electronic apparatus.
FIG. 1(d) is the cross-sectional side view showing the details of the lock part of the conventional clamp mechanism of the electronic apparatus.
Figure 2:
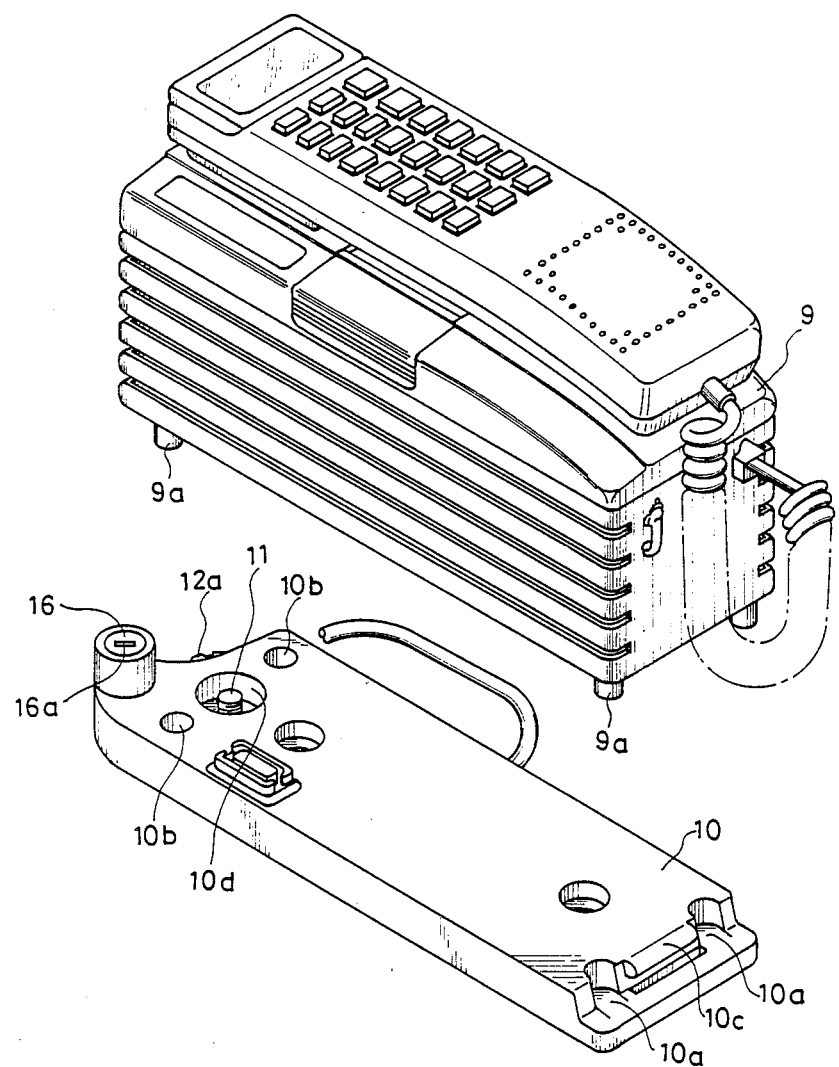
FIG. 2 is a perspective view showing a clamp mechanism of an electronic apparatus in accordance with the present invention.
Figure 3:
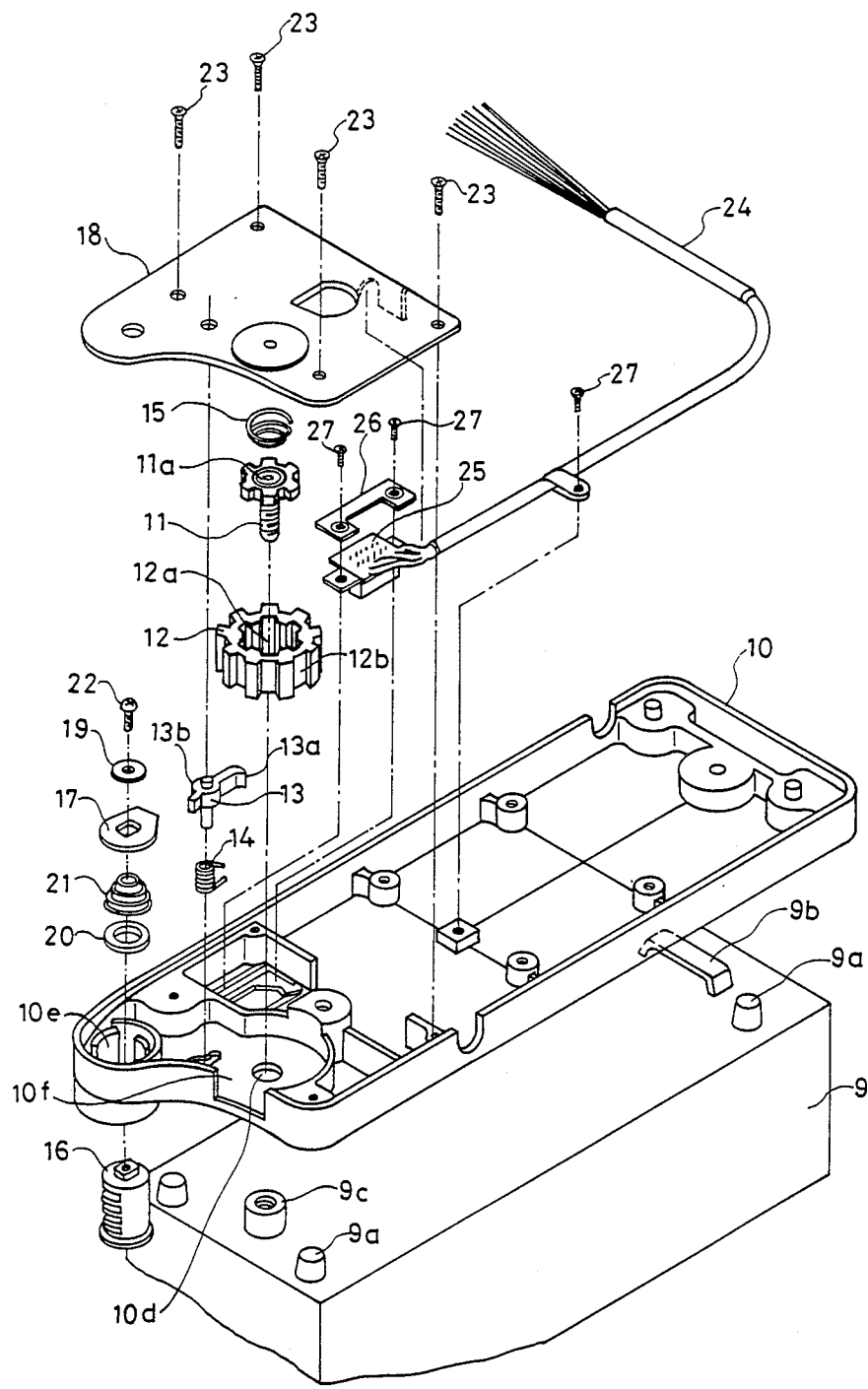
FIG. 3 is a an upside-down exploded perspective view showing the clamp mechanism of the electronic apparatus of FIG. 2 in accordance with the present invention.

An electronic apparatus such as a telephone for an automobile is shown in FIG. 2 and FIG. 3, which has plural (for example, four) legs 9a . . . 9a, a pocket shaped protrusion 9b and a female screw 9c on the bottom face. The clamp mechanism of the electronic apparatus comprises a male screw 11 for clamping the female screw 9c of the electronic apparatus, a knurled wheel 12 for rotating the male screw 11, a hook lever 13 for stopping the rotation of the knurled wheel 12, a lock unit 16 mounting a lock lever 17 for locking the movement of the hook lever, a housing 10 having a protrusion 10c for connecting with the pocket shaped protrusion 9b of the electronic apparatus 9 and a bottom cover 18 for mounting the above-mentioned elements.

Figure 4A:
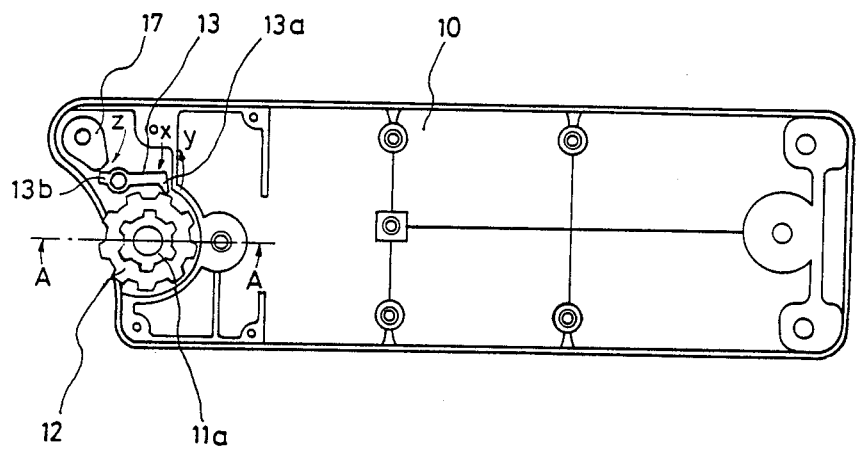
FIG. 4(a) is a partially cross-sectional plan view showing the details of a clamp mechanism of an electronic apparatus in accordance with the present invention.
Figure 4B:
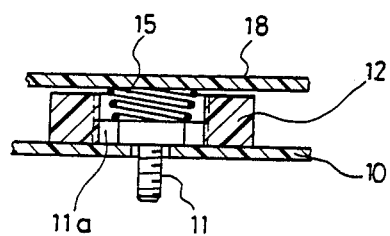
FIG. 4(b) is a cross-sectional front view showing the details of a clamp mechanism of an electronic apparatus in accordance with the present invention.

As shown in FIG. 2 the housing 10 also has two tapered recesses 10a and 10a for receiving the legs 9a and 9a of the electronic apparatus, two circular recesses 10b and 10b for receiving the legs 9a and 9a of the electronic apparatus, and as shown in FIG. 3, an opening 10f for exposing a part of a knurled wheel 12, and a recess 10d for thrusting the male screw 11. The male screw 11 has an array of protrusions around its screw head 11a. The knurled wheel 12 has an outside array of knurling grooves 12b therearound and an inside through hole 12a which has a shape exactly fitting the screw head 11a of the male screw 11. The male screw 11 is always pressed in the axial direction by a compression spring 15, so that the male screw 11 is thrusted in the axial direction along the through hole 12a of the knurled wheel 12, as shown in detail in FIG. 4(b). As shown in FIG. 4(a), the hook lever 13 has a hook 13a for engaging with one knurling groove 12b of the knurled wheel 12 and a protrusion 13b for contacting with the lock lever 17, and is pressed in the direction of arrow X, for hooking the knurling grooves 12b, by a spring 14. As the hook 13a is pointed, the knurled wheel 12 can always be rotated in the clockwise direction and can not be rotated in the counterclockwise direction but one section between the neighboring two knurling grooves. The lock unit 16 is inserted into and fixed to a hole 10e of the housing 10. The lock lever 17 is fixed on the bottom of the lock unit 16 with putting washers 19, 20 and a spring 21 by a screw 22. The bottom cover 18 is fixed on the housing 10 by screws 23. Furthermore, an electric cable 24 and a connector 25 are fixed on the housing 10 with putting, for example, an insulating plate 26 by screws 27.

At first, the assembly of the clamp mechanism is fixed, for example, to a console box of an automobile, and the cable 24 is connected, for example, to an antenna. The electronic apparatus 9 is placed on the top face of the housing 10 by engaging the pocket shaped protrusion 9b of the electronic apparatus 9 with the protrusion 10c of the housing 10 and fitting the legs 9a of the electronic apparatus 9 to the recesses 10a and 10b of the housing 10. As a result, the female screw 9c contacts with the male screw 11, and the male screw 11 engages the female screw 9c by the pressing force of the spring 15.

Hereupon, when the knurled wheel 12 is rotated, the male screw 11 is rotated thereby, and fixed to the female screw 9c of the electronic apparatus 9. As a result, the electronic apparatus 9 is firmly fixed on the housing 10 on such as the console box of the automobile.

After that, a key which is not shown in the drawings is put into a keyhole 16a of the lock unit 16 and is turned to rotate the lock lever 17, and then, the protrusion 13b of the hook lever 13 is pushed to engage the hook 13a of the hook lever 13 in one of knurling grooves 12b of the knurled wheel 12. When the knurled wheel 12 is locked, the male screw 11 can not be rotated and the electronic apparatus 9 can not be taken out. Then by taking the key out of the lock unit 16, it is impossible to steal the electronic apparatus 9.

On the contrary, in order to take out the electronic apparatus 9, the key is put into the lock unit 16 and turned to the opposite direction indicated by arrow Z for releasing the lock of the hook lever 13 in the direction of arrow Y in FIG. 4(a), and the knurled wheel 12 is made free to rotate. Accordingly the male screw 11 can be rotated to release the connection to the female screw 9c of the electronic apparatus 9, and the electronic apparatus can be taken out from the housing 10.

As mentioned above, the present invention does not need any tool for fixing or taking out the electronic apparatus 9 to or from a base member, such as the console box of the automobile.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. Clamp mechanism of an electronic apparatus comprising;

a knurled wheel having a male screw at its center axis for engagement with a female screw on the bottom of an electronic apparatus and plural knurling grooves at its peripheral part for manual rotation, a lock means for releasably locking rotation of said knurled wheel by engaging with or being detached from said knurling grooves at said peripheral part of said knurled wheel corresponding to key operation, a bottom cover which movably holds thereon said knurled wheel, said lock means, electronic cables and fixed on the bottom of a housing, and a housing for being fixed on a console box of an automobile or the like, which has at least one protrusion for engaging with a pocket of said electronic apparatus, an opening for exposing a part of said knurling grooves at said peripheral part of said knurled wheel and a hole for thrusting said male screw of said knurled wheel.

2. Clamp mechanism of an electronic apparatus in accordance with claim 1, wherein said male screw is thrusted in the axial direction of said knurled wheel.

3. Clamp mechanism of an electronic apparatus comprising;

a knurled wheel having a male screw at its center axis for engagement with a female screw on the bottom of an electronic apparatus and plural knurling grooves at its peripheral part for manual rotation, a hook lever for releasably locking rotation of said knurled wheel by engaging with or being detached from said knurling grooves at said peripheral part of said knurled wheel, a lock for controlling position of said hook lever for locking or unlocking said rotation of said knurled wheel corresponding to key operation, a bottom cover which movably holds thereon said knurled wheel, said hook lever, said lock, electronic cables and fixed on the bottom of a housing, and a housing for being fixed on a console box of an automobile or the like, which has at least one protrusion for engaging with a pocket of said electronic apparatus, an opening for exposing a part of said knurling grooves at said peripheral part of said knurled wheel and a hole for thrusting said male screw of said knurled wheel.

4. Clamp mechanism of an electronic apparatus in accordance with claim 3, wherein said male screw is thrusted in the axial direction of said knurled wheel.

* * * * *

UNITED STATES PATENT AND TRADEMARK OFFICE
CERTIFICATE OF CORRECTION

PATENT NO. : 4,756,175

DATED : July 12, 1988

INVENTOR(S) : Jyunji Matsushima, Shinji Miyata, Kunitoshi Yoshitaka

It is certified that error appears in the above-identified patent and that said Letters Patent is hereby corrected as shown below:

Title page, left line 6, change "Yoshitaka" to --Yoshitake--.

Signed and Sealed this

Tenth Day of January, 1989

*Attest:*

DONALD J. QUIGG

*Attesting Officer*      *Commissioner of Patents and Trademarks*